(12) United States Patent
Paul

(10) Patent No.: US 12,131,903 B2
(45) Date of Patent: Oct. 29, 2024

(54) PULSED-PLASMA DEPOSITION OF THIN FILM LAYERS

(71) Applicant: Applied Materials, Inc., Santa Clara, CA (US)

(72) Inventor: Khokan Chandra Paul, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/986,897

(22) Filed: Aug. 6, 2020

(65) Prior Publication Data

US 2022/0044930 A1 Feb. 10, 2022

(51) Int. Cl.
*H01L 21/02* (2006.01)
*C23C 16/455* (2006.01)
*H01J 37/32* (2006.01)

(52) U.S. Cl.
CPC .. *H01L 21/02274* (2013.01); *C23C 16/45536* (2013.01); *H01J 37/32266* (2013.01)

(58) Field of Classification Search
CPC ......... H01L 21/02274; H01L 21/02123; H01L 21/0234; H01L 21/02348; H01L 21/23055;
(Continued)

(56) References Cited

U.S. PATENT DOCUMENTS 5,962,344 A * 10/1999 Tu ...................... H01L 21/3185
438/694

6,281,146 B1 * 8/2001 Wang .................... C23C 16/402
257/E21.279
(Continued)

FOREIGN PATENT DOCUMENTS

JP  2001237446 A  *  8/2001
TW   201319299 A      5/2013
(Continued)

OTHER PUBLICATIONS

JP-2001237446-A, machine translation, originally published 2001, p. 1-10 (Year: 2001).*
(Continued)

*Primary Examiner* — Katherine A Bareford
*Assistant Examiner* — Christina D McClure
(74) *Attorney, Agent, or Firm* — Kilpatrick Townsend & Stockton LLP

(57) ABSTRACT

Examples of the present technology include semiconductor processing methods that may include generating a plasma from a deposition precursor in a processing region of a semiconductor processing chamber. The plasma may be generated at a delivered power within a first period of time when plasma power is delivered from a power source operating at a first duty cycle. The methods may further include transitioning the power source from the first duty cycle to a second duty cycle after the first period of time. A layer may be deposited on a substrate in the processing region of the semiconductor processing chamber from the generated plasma. The layer, as deposited, may be characterized by a thickness of 50 Å or less. Exemplary deposition precursors may include one or more silicon-containing precursors, and an exemplary layer deposited on the substrate may include an amorphous silicon layer.

20 Claims, 3 Drawing Sheets

(58) Field of Classification Search
CPC ........... H01L 21/6831; C23C 16/45536; C23C 16/24; C23C 16/5096; C23C 16/56; C23C 16/505; C23C 16/45527; C23C 16/45553; H01J 37/32266
See application file for complete search history.

(56) References Cited

U.S. PATENT DOCUMENTS

| | | | | |
|---|---|---|---|---|
| 6,686,232 | B1* | 2/2004 | Ngo | H01L 21/3185 438/763 |
| 10,032,609 | B1* | 7/2018 | Cheng | H01J 37/32862 |
| 2002/0139658 | A1* | 10/2002 | Kanakasabapathy | H01J 37/32422 204/164 |
| 2008/0118734 | A1* | 5/2008 | Goodwin | B05D 1/62 428/221 |
| 2010/0099271 | A1* | 4/2010 | Hausmann | H01L 21/02211 438/778 |
| 2011/0177669 | A1* | 7/2011 | Lee | H01J 37/32155 257/E21.214 |
| 2013/0183835 | A1* | 7/2013 | Nguyen | H01L 21/02274 257/E21.293 |
| 2015/0118487 | A1* | 4/2015 | Wolden | C03C 17/3464 204/192.15 |
| 2016/0172530 | A1* | 6/2016 | Tsuji | H01L 31/035281 438/94 |
| 2017/0076955 | A1* | 3/2017 | Hudson | H01L 21/67167 |
| 2017/0148630 | A1 | 5/2017 | Kim et al. | |
| 2017/0256415 | A1 | 9/2017 | Kim et al. | |
| 2017/0330764 | A1* | 11/2017 | Lai | H01L 21/67069 |
| 2018/0277338 | A1* | 9/2018 | Fukada | C23C 16/505 |
| 2019/0252158 | A1 | 8/2019 | Kulshreshtha et al. | |
| 2019/0333764 | A1 | 10/2019 | Chan et al. | |
| 2020/0066987 | A1 | 2/2020 | Sims et al. | |
| 2020/0216959 | A1 | 7/2020 | Mukherjee et al. | |

FOREIGN PATENT DOCUMENTS

| | | |
|---|---|---|
| TW | 201945586 A | 12/2019 |
| TW | 202022152 A | 6/2020 |

OTHER PUBLICATIONS

International Search Report and Written Opinion mailed Nov. 16, 2021 in International Patent Application No. PCT/US2021/043110, 9 pages.

Application No. PCT/US2021/043110 , International Preliminary Report on Patentability, Mailed on Feb. 16, 2023, 7 pages.

\* cited by examiner

PULSED-PLASMA DEPOSITION OF THIN FILM LAYERS

TECHNICAL FIELD

The present technology relates to methods and systems for semiconductor processing. More specifically, the present technology relates to systems and methods for producing thin films of semiconductor materials.

BACKGROUND

Integrated circuits are made possible by processes which produce intricately patterned material layers on substrate surfaces. Producing patterned material on a substrate requires controlled methods for forming and removing material. As device sizes continue to reduce, film characteristics may lead to larger impacts on device performance. Materials used to form layers of materials may affect operational characteristics of the devices produced. As material thicknesses continue to reduce, as-deposited characteristics of the films may have a greater impact on device performance.

Thus, there is a need for improved systems and methods that can be used to produce high quality devices and structures. These and other needs are addressed by the present technology.

SUMMARY

Embodiments of the present technology include semiconductor processing methods that may include generating a plasma from a deposition precursor in a processing region of a semiconductor processing chamber. The plasma may be generated at a delivered power within a first period of time when plasma power is delivered from a power source operating at a first duty cycle. The methods may further include transitioning the power source from the first duty cycle to a second duty cycle after the first period of time. A layer may be deposited on a substrate in the processing region of the semiconductor processing chamber from the generated plasma. The layer, as deposited, may be characterized by a thickness of 50 Å or less.

In exemplary embodiments, the plasma power used to generate the plasma for the deposition of the layer on the substrate may have an effective power of less than or about 4 Watts. The first period of time when the plasma power is operating at a first duty cycle may be less than or about 2 seconds. There may be a second period of time in which the plasma power is maintained at the second duty cycle, and that second period of time may be longer than the first period of time when the plasma power is operating at the first duty cycle. Exemplary embodiments include the first duty cycle being 20% or more, and the second duty cycle being 5% or less. Exemplary deposition precursors may include one or more silicon-containing precursors, and exemplary layers deposited on the substrate may include one or more silicon-containing layers.

Additional embodiments of the semiconductor processing methods may include generating a plasma from a deposition precursor in a processing region of a semiconductor processing chamber. The plasma may be generated at a delivered power within a first period of time when plasma power is delivered from a power source operating at a first peak power level. The methods may further include transitioning the power source from the first power level to a second peak power level after the first period of time. A layer may be deposited on a substrate in the processing region of the semiconductor processing chamber from the generated plasma. The layer, as deposited, may be characterized by a thickness of 50 Å or less.

In exemplary embodiments, the first peak power level delivered from the power source may be less than or about 60 Watts. The plasma power may be delivered at a plasma frequency pulsed at less than or about 10 kHz, and may have an effective power of less than or about 4 Watts. Exemplary deposition precursors may include one or more silicon-containing precursors, and an exemplary layer deposited on the substrate may include an amorphous silicon layer.

Still additional embodiments of the semiconductor processing methods may include flowing a deposition precursor into a processing region of a semiconductor processing chamber. A deposition plasma may be generated of the deposition precursor, and the deposition plasma may be struck with a first delivered power operating for a first period of time. The plasma may be maintained with a second delivered power operating for a second period of time. The method may further include depositing a layer on a substrate in the processing region of the semiconductor processing chamber from the generated plasma. The layer, as deposited, may be characterized by a thickness of 50 Å or less. The method may still further include treating the layer as deposited with a treatment plasma. The treatment plasma may replace the deposition plasma in the processing region of the semiconductor processing chamber.

In exemplary embodiments, the first period of time in which the deposition plasma is struck may be shorter than the second period of time in which the plasma is maintained. The first delivered power may have a first duty cycle of more than or about 20%, and the second delivered power may have a second duty cycle of less than or about 5%. The first delivered power may have a power level that is greater than a power level for the second delivered power. Exemplary deposition precursors may include silicon-containing precursors, and an exemplary layer deposited on the substrate may include a silicon-containing layer. Exemplary treatment plasmas may be generated from a treatment precursor that is free of the deposition precursors, and may include, for example, helium.

Such technology may provide numerous benefits over conventional systems and techniques. For example, embodiments of the present technology may produce thin layers characterized by a thickness of 50 Å or less using a direct plasma that is struck and maintained in the processing region of a semiconductor processing chamber. Additionally, the present technology may produce a stable, reproducible deposition plasma for depositing these thin layers on a substrate present in the processing region with the plasma. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
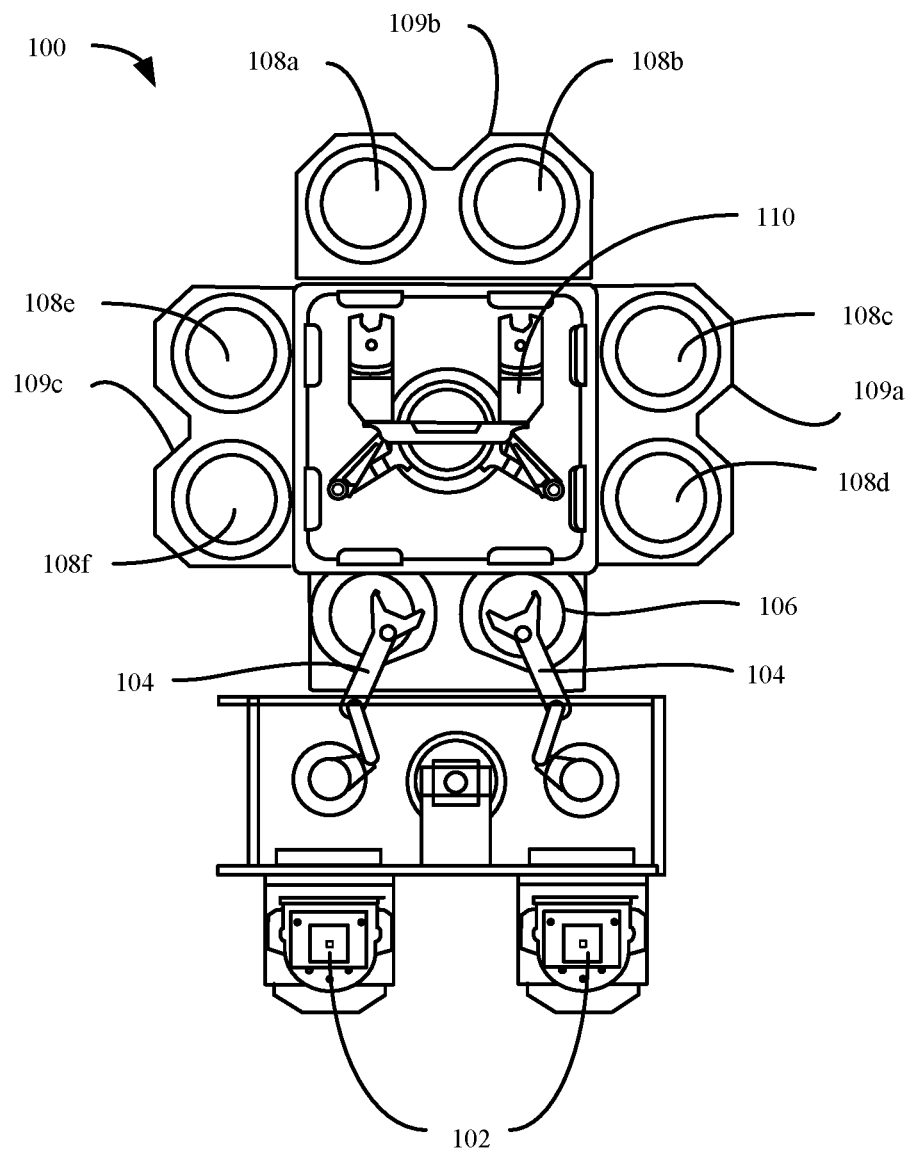
FIG. 1 shows a top view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and process methods for depositing thin layers of materials on semiconductor substrates with low-power, short-duration plasmas. Embodiments of these systems and methods address the problem of striking and maintaining these plasmas in a stable and reproducible manner without relying on a high plasma power or duty cycle. Conventional plasma generation includes delivering a threshold minimum or greater of plasma power, at a threshold minimum or greater duty cycle, to a plasma precursor. The higher the plasma power and duty cycle for generating and maintaining the deposition plasma, the higher the deposition rate of material on the substrate. In conventional plasma-enhanced chemical-vapor-depositions (PECVD), the amount of deposited material was large enough—as measured by, for example, the thickness of the deposited layer—that standard plasma powers and duty cycles were not in danger of depositing too much material during short-duration depositions.

As semiconductor device sizes continue to reduce, the need has increased to deposit smaller amounts of materials in thinner layers on substrates. Critical dimensions in many semiconductor devices, such as the width between adjacent features formed in or on the substrate, have decreased to 10 nm or less. Because the depths of many substrate features have not also decreased to the same degree, the depth-to-width ratio, referred to as the aspect ratio (AR), in the gaps between substrate features commonly exceed 10:1. Filling these gaps without creating voids, cracks, and other defects, in the deposited material has proven very challenging at the high deposition rates and deposition amounts that are typical for conventional PECVD process methods. Slowing the deposition rate and reducing the amount deposited has reduced the number of defects during a gapfill, but it has also created new problems for PECVD, namely difficulties in generating and maintaining a stable, reproducible plasma at a low power and low duty cycle.

One aspect of the present technology addresses the problems of generating and maintaining a low-power, low-duty cycle plasma to deposit a thin layer of material (e.g., less than or about 50 Å) on a substrate. Embodiments of the present technology include systems and process methods that generate and maintain a deposition plasma in a processing region of a semiconductor processing chamber over at least two periods of time have different duty cycles for the power delivered to the plasma precursors. These include a first period of time where the plasma power is delivered to the precursors from a power source operating at a first duty cycle, and a second period of time where the plasma power is delivered at a second duty cycle that is less than the first duty cycle. The first duty cycle used during the first period of time is sufficient to generate a stable, reproducible plasma from the deposition precursors in the processing region of the semiconductor processing chamber. The second duty cycle used during the second period of time is sufficient to maintain the plasma started in the first period, but reduce the deposition rate and amount of deposited material so that they do not exceed a target thinness for the deposited layer. The generation and maintenance of a stable, low-power plasma over at least two periods of time having different duty cycles permits the reproducible formation of a thin layer of material on a substrate.

Although the remaining disclosure will routinely identify specific deposition processes utilizing the disclosed technology, it will be readily understood that the systems and methods are equally applicable to other deposition and treatment processes as may occur in the described chambers or any other chamber. Accordingly, the technology should not be considered to be so limited as for use with these specific deposition processes or chambers alone. The disclosure will discuss one possible system and chamber that may be used in performing process methods according to some embodiments of the present technology before additional variations and adjustments to this system according to embodiments of the present technology are described.

FIG. 1 shows a top plan view of one embodiment of a semiconductor processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
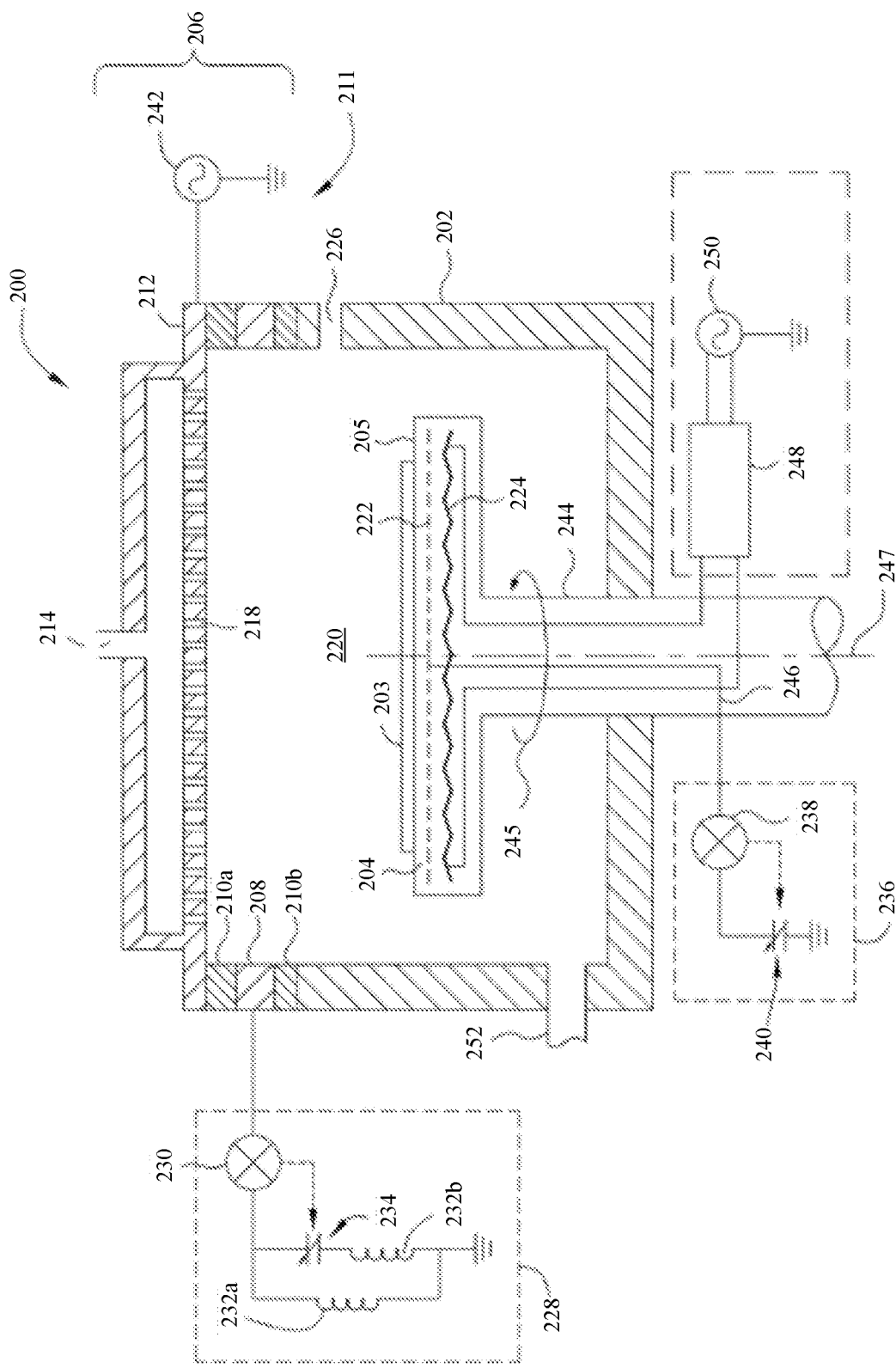
FIG. 2 shows a schematic cross-sectional view of an exemplary semiconductor processing chamber according to some embodiments of the present technology.

FIG. 2 shows a schematic cross-sectional view of an exemplary semiconductor processing chamber 200 according to some embodiments of the present technology. The figure may illustrate an overview of a system incorporating one or more aspects of the present technology, and/or which may be specifically configured to perform one or more operations according to embodiments of the present technology. Additional details of chamber 200 or methods performed may be described further below. Chamber 200 may be utilized to form thin film layers according to some embodiments of the present technology, although it is to be understood that the methods may similarly be performed in any chamber within which film formation may occur. The semiconductor processing chamber 200 may include a chamber body 202, a substrate support 204 disposed inside the chamber body 202, and a lid assembly 206 coupled with the chamber body 202 and enclosing the substrate support 204 in a processing region 220. A substrate 203 may be provided to the processing region 220 through an opening 226, which may be conventionally sealed for processing using a slit valve or door. The substrate 203 may be seated on a surface 205 of the substrate support during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the processing chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous loop around a circumference of the processing chamber 200 surrounding the processing region 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210a, 210b, which may be a dielectric material such as a ceramic or metal oxide, for example aluminum oxide and/or aluminum nitride, may contact the first electrode 208 and separate the first electrode 208 electrically and thermally from a gas distributor 212 and from the chamber body 202. The gas distributor 212 may define apertures 218 for distributing process precursors into the processing region 220. The gas distributor 212 may be coupled with a first source of electric power 242, such as an RF generator, RF power source, DC power source, pulsed DC power source, pulsed RF power source, or any other power source that may be coupled with the processing chamber. In some embodiments, the first source of electric power 242 may be an RF power source.

Embodiments of the present technology include at least one of source of electric power to deliver pulsed RF power to deposition precursors in the processing region 220 to generate a plasma from the precursors. In some embodiments of processing chamber 200, this pulsed RF power may be delivered by the first source of electric power 242. The source of electric power may deliver plasma power at a first duty cycle during a first period of time during which the plasma is struck in the processing region 220. In some embodiments, the source of electric power transitions from the first duty cycle to a second duty cycle that maintains the deposition plasma during the remainder of the deposition of a layer on the substrate 203.

The plasma power delivered with the first duty cycle to strike the plasma may be greater than the plasma power delivered with the second duty cycle to maintain the plasma. Exemplary embodiments include a first duty cycle of 20% or more and a second duty cycle of 5% or less. Exemplary first periods of time during which the plasma power is delivered to the deposition precursors and/or plasma at the first duty cycle may be less than or about 2 seconds. Exemplary levels of effective plasma power delivered to the deposition precursors and/or plasma during the first period of time may be about 4 Watts or less.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the processing chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing region 220 during processing. In some embodiments as illustrated, the first tuning circuit 228 may include a first circuit leg and a second circuit leg coupled in parallel between ground and the first electronic sensor 230. The first circuit leg may include a first inductor 232A. The second circuit leg may include a second inductor 232B coupled in series with the first electronic controller 234. The second inductor 232B may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing region 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing region 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit. The second source of electric power 250 may be DC power, pulsed DC power, RF bias power, a pulsed RF source or bias power, or a combination of these or other power sources. In some embodiments, the second source of electric power 250 may be an RF bias power. The substrate support 204 may also include one or more heating elements configured to heat the substrate to a processing temperature, which may be between about 25° C. and about 800° C. or greater.

In some embodiments, the second source of electric power 250 may be a pulsed RF power source. Additional embodiments include both the first source of electric power 242 and the second source of electric power 250 being pulsed RF power sources. In some of these embodiments, the first and second sources of electric power 242, 250, may work together to provide the plasma power that generates and maintains the deposition plasma during the deposition of a layer of material on the substrate 203. For example, one of the sources of electric power may deliver plasma power at a first duty cycle during a first period of time, and the other source of electric power may deliver plasma power at a second duty cycle following the first period of time (e.g., a second period of time). In still further embodiments, the first or second source of electric power 242, 250, delivers the plasma power to the deposition precursors and plasma both during and after the first period of time, at both the first and second duty cycles.

The first and/or second sources of electric power 242, 250, may provide plasma power at adjustable RF generation frequencies and pulsing frequencies. For example, the plasma power may be generated at a plasma-generation frequency, such as 13.56 MHz in one non-limiting example. The plasma power may also be pulsed at a pulsing frequency that may be less than or about 10 kHz, and may be less than or about 9 kHz, less than or about 8 kHz, less than or about 7 kHz, less than or about 6 kHz, less than or about 5 kHz, less than or about 4 kHz, less than or about 3 kHz, less than or about 2 kHz, less than or about 1 kHz, or less.

The lid assembly 206 and substrate support 204 of FIG. 2 may be used with any processing chamber for plasma or thermal processing. In operation, the processing chamber 200 may afford real-time control of plasma conditions in the processing region 220. The substrate 203 may be disposed on the substrate support 204, and deposition precursors and other process gases may be flowed through the lid assembly 206 using an inlet 214 according to any desired flow plan. Gases may exit the processing chamber 200 through an outlet 252. Electric power may be coupled with the gas distributor 212 to establish a plasma in the processing region 220. The substrate may be subjected to an electrical bias using the third electrode 224 in some embodiments.

Upon energizing a plasma in the processing region 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to limit the deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232A and the second inductor 232B, may be chosen to provide an impedance range. This range may depend on the frequency, duty cycle, and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A set point for current, voltage, duty cycle, and/or RF frequency, depending on the type of sensor used, may be installed in each sensor, and the sensor may be provided with control software that determines an adjustment to each respective electronic controller 234, 240 to minimize deviation from the set point. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 3:
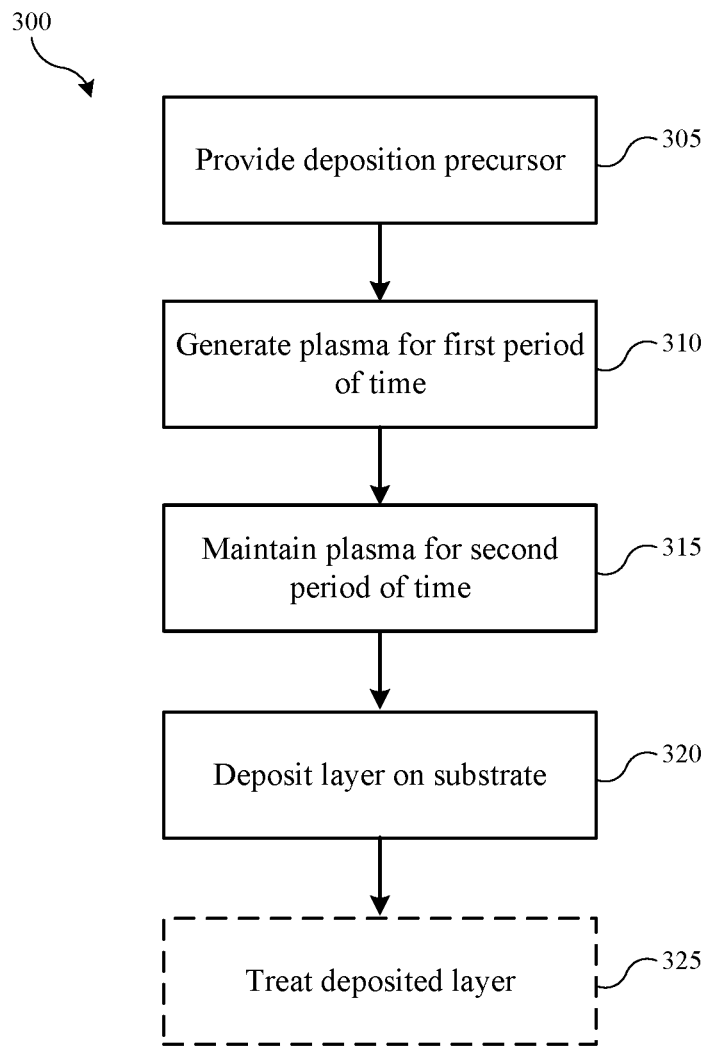
FIG. 3 shows operations in a semiconductor processing method according to some embodiments of the present technology.

FIG. 3 shows exemplary operations in a processing method 300 according to some embodiments of the present technology. The method may be performed in a variety of processing chambers, including processing chamber 200 described above. Method 300 may include one or more operations prior to the initiation of the stated method operations, including front end processing, deposition, etching, polishing, cleaning, or any other operations that may be performed prior to the described operations. The method may include a number of optional operations as denoted in the figure, which may or may not specifically be associated with the method according to the present technology. For example, many of the operations are described in order to provide a broader scope of the semiconductor process, but are not critical to the technology, or may be performed by alternative methodology as will be discussed further below.

Method 300 may involve optional operations to develop the semiconductor structure to a particular fabrication operation. Although in some embodiments method 300 may be performed on a base structure, in some embodiments the method may be performed subsequent other material formation or removal. For example, any number of deposition, masking, or removal operations may be performed to produce any transistor, memory, or other structural aspects on a substrate. In some embodiments one or more structures formed on a substrate may be characterized by a thermal budget of less than or about 500° C., less than or about 450° C., less than or about 400° C., or less. Accordingly, method 300 and any subsequent operations may be performed at temperatures that are at or below the structural thermal budget. The substrate may be disposed on a substrate support, which may be positioned within a processing region of a semiconductor processing chamber. The operations to produce the underlying structures may be performed in the same chamber in which aspects of method 300 may be performed, and one or more operations may also be performed in one or more chambers on a similar platform as a chamber in which operations of method 300 may be performed, or on other platforms.

In some embodiments, method 300 may include forming and treating a thin layer (e.g., less than or about 50 Å) of a deposited material on a substrate. The methods may include providing a deposition precursor to a substrate processing region of a substrate processing chamber where a substrate is housed at operation 305. The deposition precursor may be a single compound or a combination of two or more compounds. For example, the deposition precursor may be a combination of at least one deposition compound that produces plasma effluents that form the deposited layer material on the substrate (e.g., a silicon-containing deposition precursor) and at least one inert compound, such helium or argon, that helps carry the at least one deposition compound into the substrate processing region of the processing chamber. Specific examples of deposition precursors include silicon-containing precursors such as silane, and tetrasilane, among other silicon-containing precursors. Examples of deposition precursors also include hydrogen ($H_2$) and nitrogen ($N_2$). Exemplary processing pressures of the deposition precursor in the substrate processing region of the processing chamber may be greater than or about 1 Torr, greater than or about 2 Torr, greater than or about 5 Torr, greater than or about 10 Torr, and greater than or about 20 Torr, among other processing pressure ranges.

At operation 310, a plasma is generated from the deposition precursor in the substrate processing region for a first period of time. The first period may include the initial striking of the plasma and the stabilization of the struck plasma. The generation of the plasma at operation 310 includes delivering power from a power source operating at a first duty cycle to the deposition precursor. The power source may be a pulsed, RF power source operating at a first duty cycle of 20% or more. Additional examples of first duty cycles include 25% or more, 30% or more, 35% or more, 40% or more, 45% or more, 50% or more, among other duty cycle ranges. Exemplary ranges for the first period of time include less than or about 2 seconds, less than or about 1.5 seconds, less than or about 1 second, less than or about 0.5 seconds, among other time ranges.

The plasma power delivered during the first period of time may be of low-power, and have a peak power of less than or about 100 Watts. Additional examples of peak power ranges include less than or about 80 Watts, less than or about 60 Watts, less than or about 50 Watts, and less than or about 40 Watts, among other power ranges. The plasma power drops to 0 Watts during the "off" portions of the duty cycle, which gives an effective (i.e., average) plasma power that is significantly lower than the peak power. The effective plasma power delivered to the deposition precursors and/or plasma during the first period of time may be less than or about 40 Watts, less than or about 30 Watts, less than or about 20 Watts, less than or about 10 Watts, and less than or about 5 Watts, among other effective power ranges.

The generation of the plasma during the first period of time may include the stabilization of the plasma to assist in providing reproducible depositions of the layers at thicknesses of less than or about 50 Å. A stable plasma has a variation of 10% or less in one or more plasma characteristics such as plasma delivered power, plasma forward power, plasma reflected power, plasma set-point power, and plasma ion density, among other characteristics.

At the end of the first period of time, the plasma may be maintained under different conditions for a second period of time 315. In some embodiments, the different conditions may include maintaining the plasma with a power source having a second duty cycle that is shorter than the first duty cycle. This may be accomplished by transitioning the power source delivering power to the deposition precursors and plasma during the first period of time from the first duty cycle to the second duty cycle. In additional embodiments, as first power source delivering power at the first duty cycle during the first period of time may be transitioned to a second power source in the processing chamber that delivers power at the second duty cycle for a second period of time. The second duty cycle may be less than the first duty cycle. Exemplary second duty cycles may include 5% or less, 4% or less, 3% or less, 2% or less, and 1% or less, among other duty cycle ranges. A second duty cycle that is lower than the first duty cycle permits more precise control of the endpoint of the deposition.

In additional embodiments, the different conditions for the maintenance of the plasma in the second period of time may include delivering a plasma power at a second power level that is different from a first power level in the first period of time. In some embodiments, the second power level may be lower than the first power level. Exemplary second power levels may include peak power of less than or about 80 Watts, less than or about 60 Watts, less than or about 50 Watts, and less than or about 40 Watts, less than or about 30 Watts, less than or about 20 Watts, and less than or about 10 Watts, among other ranges for the second power level. The plasma power drops to 0 Watts during the "off" portions of the second duty cycle, which gives an effective (i.e., average) second plasma power that is significantly lower than the peak power. The effective second plasma power delivered to the deposition precursors and/or plasma during the first period of time may be less than or about 10 Watts, less than or about 7.5 Watts, less than or about 5 Watts, less than or about 4 Watts, and less than or about 2 Watts, among other effective power ranges.

The deposition plasma may be maintained with plasma power delivered in a second period of time with a duty cycle and/or power level that is lower than the plasma power delivered in the first period of time. In some embodiments, the second period of time is longer than the first period of time. Exemplary ranges for the second period of time include more than 2 seconds, more than or about 2.5 seconds more than or about 3 seconds, more than our about 4 seconds, and more than or about 5 seconds, among other time ranges.

The generated and maintained deposition plasma deposited a layer of a material on the substrate at operation 320. The deposition plasma and the substrate may both be located in a substrate processing region of the substrate processing chamber to provide a direct plasma deposition of the layer on the substrate. In some embodiments, the layer is deposited at two or more different deposition rates between the first period of time and subsequent periods of time until the layer reaches a final thickness. For example, a first portion of the layer may be deposited at a first deposition rate during the first period of time, and a second portion of the layer may be deposited at a second deposition rate, lower than the first deposition rate, during a second period of time. In some embodiments, the second period of time deposits the remainder of the layer on the substrate, while in additional embodiments an additional portion of the layer may be deposited after the deposition of the layer material during the second period of time. Exemplary first deposition rates of the layer material during the first period of time may include ranges of greater than or about 5 Å/second, greater than or about 7 Å/second, greater than or about 10 Å/second, among other first deposition rates. Exemplary second deposition rates of the layer material during the second period of time include ranges of less than 10 Å, less than 5 Å/second, less than or about 3 Å/second, less than or about 2 Å/second, and less than or about 1 Å/second, among other second deposition rates. Exemplary final thicknesses of the as-deposited layer may be for example, about 50 Å or less. Other exemplary thickness ranges include less than or about 40 Å, less than or about 30 Å, less than or about 20 Å, and less than or about 10 Å, among other thickness ranges.

In embodiments of the present technology, examples of the composition of the deposited layer include silicon-containing layers. Specific examples of silicon-containing layers include amorphous silicon, doped silicon, and crystalline silicon, among other silicon-containing layers.

In some embodiments, the substrate on which the layer of material is formed may be further treated in a treatment process at optional operation 325. The optional post-deposition treatment may be performed in the same chamber as the deposition, or the substrate may be transferred from a first processing chamber to a second processing chamber. In some embodiments, the second chamber may be on the same tool, such as previously described, and the transfer may be performed while maintaining vacuum conditions for the substrate. The treatment process may be configured to anneal, densify, etch, polish, and/or pattern the as-deposited layer, among other treatment processes. Optional treatment processes may include any number of processes configured to provide additional energy transfer. For example, the treatment process may be a thermal anneal performed at a temperature that does not exceed a thermal budget for the substrate (e.g., less than or about 550° C.). Additional examples of treatment processes may include UV exposure, microwave exposure, or in situ plasma exposure. These exposure treatments may be performed for greater than or about 10 seconds, greater than or about 30 seconds, greater than or about 1 minute, greater than or about 2 minutes, greater than or about 5 minutes, greater than or about 10 minutes, greater than or about 15 minutes, or more. Embodiments of treatment operations that include in situ plasma exposure may include exposing the deposited layer with a treatment plasma generated from a treatment precursor. The treatment precursor that may include hydrogen and/or an inert gas, such as helium or argon, among other treatment precursors. The treatment plasma may be formed at low power to limit sputtering of the film produced, and in some embodiments the treatment plasma may be formed at less than or about 2,500 W, and may be formed at less than or about 2,000 W, less than or about 1,500 W, less than or about 1,000 W, less than or about 500 W, or less.

The formation and treatment of the layers of deposited material as described in method 300 may be performed within the thermal budget of the substrate. Exemplary temperature ranges for the thermal budget may include less than or about 550° C., less than or about 500° C., less than or about 450° C., less than or about 400° C., less than or about 350° C., less than or about 300° C., or less, among other thermal budget temperature ranges. Accordingly, the layer of material may be deposited and optionally treated at or below any of these temperatures in some embodiments to accommodate the underlying materials, and in some embodiments one or more operations, including all operations of method 300, may be performed at or below any of these temperatures, and a substrate being processed may be maintained below or about any of these temperatures throughout processing.

Embodiments of the present technology further include treatment processes that have two or more cycles of forming and treating a thin layers of a deposited material on a substrate as described above in method 300. For example, a second cycle of forming a second layer of deposited material may be performed after a first layer of the material has been deposited and treated in the first cycle. The deposition of additional layers of material can limit formation of pores and other incongruities in the surface of the previously deposited layer. In some embodiments, each cycle of deposition and optional treatment may form a layer that represents a fraction of the total amount of the material deposited on the substrate. For example, each layer of deposited material may represent less than or about 50% of a total thickness of the film, less than or about 30%, less than or about 25%, less than or about 20%, or less, of the total amount of the material deposited on the substrate. When a cycle includes an optional treatment operation following a layer deposition, the treatment operation may be performed within the deposition chamber, and other energy treatments may be performed in a chamber on the same tool as the deposition chamber to reduce delays between the deposition and treatment operations.

The present technology includes embodiments of process methods that permit the reproducible deposition of materials on a substrate that are significantly thinner than a layer of material deposited by conventional PECVD methods. The reproducibility of the depositions is achieved in part by generating a deposition plasma through the delivery of plasma power at a first duty cycle and/or plasma power during a first period of time and then maintaining the deposition plasma at a second duty cycle and/or plasma power that is lower than the first duty cycle and/or plasma power. The thin layer of deposited material formed on the substrate has fewer deposition defects such as voids and cracks, and is thin enough to permit a more thorough penetration of heat, UV light, plasma ions, etc., through the layer during a treatment operation. As the critical dimensions of substrate features continue to decrease, and the amounts and thickness of material layers deposited on those substrates also decrease, the present technology extends the viability of direct plasma deposition for forming these layers.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   generating a plasma from a deposition precursor in a processing region of a semiconductor processing chamber, wherein the plasma is initially struck and generated at a delivered power within a first period of time, and wherein plasma power is delivered from a power source operating at a first duty cycle;
   transitioning the power source from the first duty cycle to a second duty cycle after the first period of time, wherein the first period of time is based on a time until the plasma becomes stable after being struck, wherein the plasma is determined to be stable when a plasma characteristic has a variation of about 10% or less; and
   depositing a layer on a substrate in the processing region of the semiconductor processing chamber from the generated plasma, wherein the layer as deposited is characterized by a thickness of less than 50 Å, wherein the plasma is maintained for a second period of time at the second duty cycle, and wherein the second period of time is longer than the first period of time.

2. The semiconductor processing method of claim 1, wherein the plasma power has an effective power of less than or about 4 Watts.

3. The semiconductor processing method of claim 1, wherein the first period of time is less than or about 2 seconds and the second period of time is greater than or about 2 seconds.

4. The semiconductor processing method of claim 1, wherein wherein the plasma characteristic comprises a plasma forward power.

5. The semiconductor processing method of claim 1, wherein the first duty cycle is 20% or more.

6. The semiconductor processing method of claim 1, wherein the second duty cycle is 5% or less.

7. The semiconductor processing method of claim 1, wherein the plasma characteristic comprises a plasma reflected power.

8. The semiconductor processing method of claim 1, wherein the plasma characteristic comprises a plasma setpoint power.

9. A semiconductor processing method comprising:
   generating a plasma from a deposition precursor in a processing region of a semiconductor processing chamber, wherein the plasma is initially struck and generated at a delivered power within a first period of time, and wherein plasma power is delivered from a power source operating at a first peak power level that is less than or about 60 W;
   transitioning the power source from the first peak power level to a second peak power level after the first period of time, wherein the first period of time is based on a time until the plasma becomes stable after being struck, wherein the plasma is determined to be stable when a plasma characteristic has a variation of about 10% or less; and
   depositing a layer on a substrate in the processing region of the semiconductor processing chamber from the generated plasma, wherein the layer as deposited is characterized by a thickness of less than 50 Å.

10. The semiconductor processing method of claim 9, wherein the first peak power level is greater than the second peak power level.

11. The semiconductor processing method of claim 9, wherein the plasma characteristic comprises a plasma ion density.

12. The semiconductor processing method of claim 9, wherein the plasma power is delivered at a plasma frequency pulsed at less than or about 10 kHz.

13. The semiconductor processing method of claim 9, wherein the plasma power has an effective power of less than or about 4 Watts.

14. The semiconductor processing method of claim 9, wherein the layer deposited on the substrate comprises an amorphous silicon layer.

15. A semiconductor processing method comprising:
   flowing a deposition precursor into a processing region of a semiconductor processing chamber;
   generating a deposition plasma of the deposition precursor, wherein the deposition plasma is initially struck with a first delivered power operating for a first period of time until the deposition plasma becomes stable after being struck, wherein the plasma is determined to be stable when a plasma characteristic has a variation of about 10% or less, and wherein the plasma is maintained with a second delivered power operating for a second period of time that is longer than the first period of time;
   depositing a layer on a substrate in the processing region of the semiconductor processing chamber from the generated plasma, wherein the layer as deposited is characterized by a thickness of less than 10 Å; and
   treating the layer as deposited with a treatment plasma, wherein the treatment plasma replaces the deposition plasma in the processing region of the semiconductor processing chamber.

16. The semiconductor processing method of claim 15, further comprising:
   repeating the flowing, generating, depositing, and treating steps to gradually deposit a silicon-based film that is less than 50 Å.

17. The semiconductor processing method of claim 15, wherein the first delivered power has a duty cycle of more than or about 20%, and the second delivered power has a duty cycle of less than or about 5%.

18. The semiconductor processing method of claim 15, first delivered power has a power level that is greater than a power level for the second delivered power.

19. The semiconductor processing method of claim 15, wherein the deposition precursor comprises a silicon-containing precursor.

20. The semiconductor processing method of claim 15, wherein the treatment plasma is generated from a treatment precursor comprising helium.

\* \* \* \* \*